(12) United States Patent
Hsu et al.

(10) Patent No.: US 12,506,121 B2
(45) Date of Patent: Dec. 23, 2025

(54) LED PIXEL UNIT, DISPLAY PANEL AND DISPLAY SCREEN

(71) Applicant: Xiamen Extremely PQ Display Technology Co., Ltd., Xiamen (CN)

(72) Inventors: Chen-Ke Hsu, Xiamen (CN); Sujuan Zhang, Xiamen (CN)

(73) Assignee: Xiamen Extremely PQ Display Technology Co., Ltd., Xiamen (CN)

( * ) Notice: Subject to any disclaimer, the term of this patent is extended or adjusted under 35 U.S.C. 154(b) by 341 days.

(21) Appl. No.: 18/098,340

(22) Filed: Jan. 18, 2023

(65) Prior Publication Data

US 2023/0223384 A1 Jul. 13, 2023

(30) Foreign Application Priority Data

Dec. 24, 2021 (CN) .......................... 202123284611.8

(51) Int. Cl.
*H01L 25/075* (2006.01)
*H10H 20/855* (2025.01)

(52) U.S. Cl.
CPC ....... *H01L 25/0753* (2013.01); *H10H 20/855* (2025.01)

(58) Field of Classification Search
CPC ........................... H01L 25/0753; H10H 20/855
USPC .......................................................... 257/79
See application file for complete search history.

(56) References Cited

U.S. PATENT DOCUMENTS

| | | | | |
|---|---|---|---|---|
| 2011/0291131 A1* | 12/2011 | Ito | .................. | H10H 20/853 257/E33.061 |
| 2013/0002730 A1* | 1/2013 | Tanigawa | ............. | G02B 3/0018 445/24 |
| 2021/0333553 A1* | 10/2021 | Chiu | .................. | G02B 27/0172 |
| 2022/0178517 A1* | 6/2022 | Vissenberg | ............ | H05B 47/17 |

FOREIGN PATENT DOCUMENTS

| | | |
|---|---|---|
| CN | 104680948 B | 6/2015 |
| CN | 104732928 B | 6/2015 |

* cited by examiner

*Primary Examiner* — Eliseo Ramos Feliciano
*Assistant Examiner* — Mikka Liu
(74) *Attorney, Agent, or Firm* — WPAT, PC

(57) ABSTRACT

Provided are an LED pixel unit, a display panel and a display screen. The LED pixel unit includes: micro-LEDs, arranged on a circumferential line with a point A as a center and R as a radius; the micro-LEDs are provided with light-emitting surfaces with a same orientation, emitting lights of the micro-LEDs are capable of rotating around a preset axis by a predetermined angle and then coinciding with each other, and the preset axis passes through the point A and is perpendicular to a plane where the circumferential line is located; and an optical component, arranged to face toward the light-emitting surfaces of the micro-LEDs and have a preset distance with respect to the light-emitting surfaces, and the optical component is configured to receive the emitting lights, and enable the emitting lights to emit from the optical component at a preset light-emitting angle.

17 Claims, 5 Drawing Sheets

LED PIXEL UNIT, DISPLAY PANEL AND DISPLAY SCREEN

TECHNICAL FIELD

The present disclosure relates to the field of display technology, and in particular to a light emitting diode (LED) pixel unit, a display panel, and a display screen.

DESCRIPTION OF RELATED ART

Micro-LED display technology is a new generation of display technology, which mainly miniaturizes and matrixes a traditional LED, so that a dimension of a single LED can be reduced to tens of microns or even a few microns, and each LED pixel can be driven to emit light independently. A spacing between each two adjacent micro-LEDs is smaller than 0.6 millimeters (mm). Compared with a traditional display device, a display device made of a micro-LED has the advantages of high contrast, fast response speed and low energy consumption.

The display device is made by horizontally laying red, green and blue micro-LEDs on a two-dimensional plane, and each pixel unit includes red, green and blue micro-LEDs. When the above display device is applied to a projection product with a small light-emitting angle or a display product with a small viewing angle, it is required to set an optical component at a light-emitting side of the display device, and use the optical component to reduce a light-emitting angle of each pixel unit. In a same pixel unit, since the red, green and blue light micro-LEDs are horizontally arranged on a two-dimensional plane according to a predetermined linear direction, light-emitting angles of emitting lights of the three micro-LEDs are different, and thus after passing through the optical component, the light-emitting angle of the three micro-LEDs are still different, there will be a phenomenon that only part of the emitting lights of the three micro-LEDs are mixed, which will easily lead to a dispersion phenomenon. Moreover, due to the dispersion phenomenon, a color difference problem of a displayed image at different viewing angles will be easily caused.

Therefore, how to provide an LED pixel unit, a display panel, and a display device to avoid the dispersion phenomenon of the LED pixel unit and the color difference problem at different viewing angles caused by the dispersion phenomenon has become an urgent problem to be solved in the field.

SUMMARY

An objective of the present disclosure is to provide an LED pixel unit, which can enable emitting lights of multiple micro-LEDs in a same LED pixel unit to enter an optical component at a same first angle and to emit from the optical component at a same second angle, thereby to avoid a dispersion phenomenon of the LED pixel unit and a color different problem at different viewing angles caused by the dispersion phenomenon.

Further, another objective of the present disclosure is to provide a display panel and a display screen.

In a first aspect, an embodiment of the present disclosure provides an LED pixel unit, including:

multiple micro-LEDs with different light-emitting wavelengths, arranged on a circumferential line with a point A as a center and R as a radius; where the multiple micro-LEDs are provided with light-emitting surfaces with a same orientation, respectively; emitting lights of the multiple micro-LEDs are capable of rotating around a preset axis by a predetermined angle and then coinciding with each other; and the preset axis is configured to pass through the point A and is perpendicular to a plane where the circumferential line is located; and an optical component, arranged to face toward the light-emitting surfaces of the multiple micro-LEDs and have a preset distance with respect to the light-emitting surfaces; where an area of a projection of the optical component on a vertical projection is greater than or equal to an area of a projection of the multiple micro-LEDs on the vertical projection; and the optical component is configured to receive the emitting lights from the light-emitting surfaces, and enable the emitting lights from the light-emitting surfaces to emit from the optical component at a preset light-emitting angle.

In an illustrative embodiment, each of the light-emitting surfaces comprises a light-emitting area and a non-light-emitting area, the light-emitting area is located on a side of a corresponding micro-LED of the multiple micro-LEDs near the point A, and the non-light-emitting area is located on a side of the corresponding micro-LED of the multiple micro-LEDs far away from the point A.

In an illustrative embodiment, a spacing $d_1$ between the light-emitting area and the point A is smaller than or equal to a length $d_2$ of the light-emitting area in a radial direction of the circumferential line, and a ratio between the spacing $d_1$ and the spacing $d_2$ is a preset value.

In an illustrative embodiment, a spacing $d_1$ between the light-emitting area and the point A is greater than a length $d_2$ of the light-emitting area in the radial direction of the circumferential line, and a ratio between the spacing $d_1$ and the spacing $d_2$ is a preset value.

In an illustrative embodiment, a spacing $d_1$ between the light-emitting area and the point A is in a range from 1 μm to 100 μm, and a length $d_2$ of the light-emitting area in a radial direction of the circumferential line is in a range from 1 μm to 100 μm.

In an illustrative embodiment, the spacing $d_1$ between the light-emitting area and the point A is in a range from 2 μm to 4 μm, and the length $d_2$ of the light-emitting area in the radial direction of the circumferential line is in a range from 8 μm to 15 μm.

In an illustrative embodiment, the multiple micro-LEDs are evenly distributed on the circumferential line.

In an illustrative embodiment, an angle between each two adjacent micro-LEDs of the multiple micro-LEDs is 120°.

In an illustrative embodiment, an angle between some adjacent micro-LEDs of the multiple micro-LEDs is 90°, and an angle between some adjacent micro-LEDs of the multiple micro-LEDs is 180°.

In an illustrative embodiment, a central axis of the optical component coincides with the preset axis; or an angle $\alpha_1$ between the central axis of the optical component and the preset axis is greater than 5°.

In an illustrative embodiment, a light-emitting angle of the LED pixel unit is smaller than or equal to 80°.

In an illustrative embodiment, the LED pixel unit includes two spacers, the two spacers are arranged to be opposite to one another and to be spaced by a preset spacing, and the multiple micro-LEDs are dependently arranged in the preset spacing.

In an illustrative embodiment, the multiple micro-LEDs are packaged together to form a MicroLED in Package (Mip) LED.

In an illustrative embodiment, a first end of each of the multiple micro-LEDs facing toward the point A is configured to receive a negative driving voltage, and a second end of each of the multiple micro-LEDs facing away from the point A is configured to receive a positive driving voltage.

In an illustrative embodiment, a first end of each of the multiple micro-LEDs facing toward the point A is configured to receive a positive driving voltage, and a second end of each of the multiple micro-LEDs facing away from the point A is configured to receive a negative driving voltage.

In an illustrative embodiment, the emitting lights of the multiple micro-LEDs are capable of entering the optical component at a same first angle, and emitting from the optical component at a same second angle.

In an illustrative embodiment, a sum of widths of the multiple micro-LEDs is smaller than or equal to a width of the optical component, and a sum of lengths of the multiple micro-LEDs is smaller than or equal to a length of the optical component.

In a second aspect, an embodiment of the present disclosure provides a display panel, including: a substrate; and multiple pixel units arranged on the substrate, where each of the multiple pixel units is the LED pixel unit described above, the multiple micro-LEDs are arranged on the substrate, and the optical component is arranged at a side of the multiple micro-LEDs facing away from the substrate.

In an illustrative embodiment, a central axis of the optical component and the preset axis are each perpendicular to the substrate; or, the central axis of the optical component is perpendicular to the substrate, and an angle $\beta_1$ between the preset axis and the substrate is greater than 5°.

In a third aspect, an embodiment of the present disclosure provides a display screen including the display panel described above.

Compared with the related art, the present disclosure has at least the following beneficial effects.

1) Multiple micro-LEDs of a same LED pixel unit are arranged on a circumferential line with a point A as a center and R as a radius, emitting lights of the multiple micro-LEDs coincide after rotating around a preset axis by a predetermined angle, and the preset axis is configured to pass through the point A and is perpendicular to a plane where the circumferential line is located. Further, the emitting lights of the multiple micro-LEDs can enter an optical component at a same first angle, and can emit from the optical component at a same second angle, thereby avoiding the dispersion phenomenon of the LED pixel unit, and further avoiding the color difference problem at different viewing angles of the LED pixel unit caused by the dispersion phenomenon, especially for the LED pixel unit with a small light-emitting angle.

2) A light-emitting surface of each micro-LED includes a light-emitting area and a non-light-emitting area, the light-emitting area is located on a side of the micro-LED facing toward the point A, and a spacing $d_1$ between the light-emitting area and the point A is smaller. Therefore, the multiple micro-LEDs can be configured to have a structure similar to a point light source, thereby avoiding the dispersion phenomenon of the LED pixel unit and the color difference problem at different viewing angles. When the multiple micro-LEDs are matched with the optical component, a central axis of the optical component coincides with the preset axis, so that the LED pixel unit can emit lights, which are approximately parallel with each other.

BRIEF DESCRIPTION OF DRAWINGS

In order to explain technical solutions of embodiments of the present disclosure more clearly, accompanying drawings that required to be used in the embodiments will be briefly introduced hereinafter. It should be understood that the accompanying drawings merely show some embodiments of the present disclosure, and should not be regarded as limiting the scope of protection of the present disclosure. For those of ordinary skill in the field, other relevant drawings can be obtained according to these accompanying drawings without any creative effort.

Figure 1:
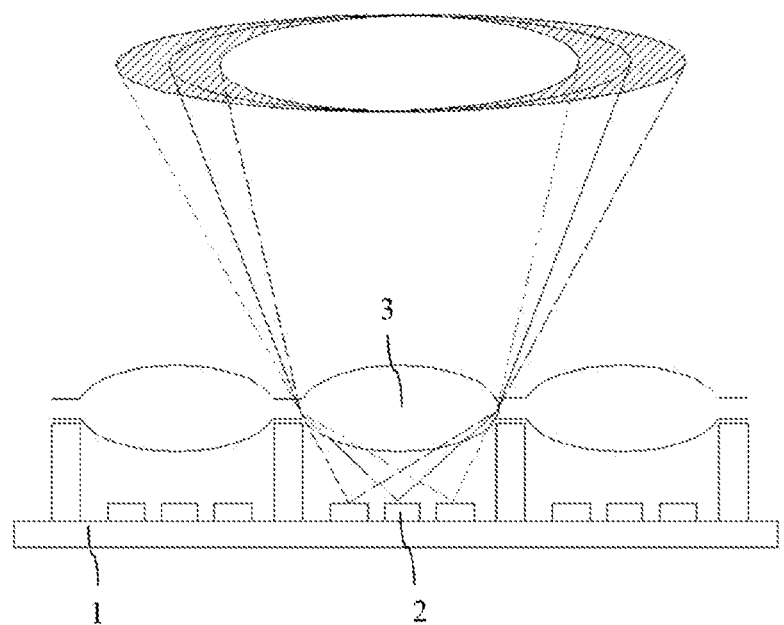
FIG. 1 illustrates a schematic structural view of a display device in a related art.

Reference numerals: 1—Substrate; 010—First semiconductor layer; 2—Micro-LED; 011—First stepped surface; 3—Optical component; 012—Second stepped surface; 10—Micro-LED; 013—Light-emitting area; 11—First micro-LED; 014—Non-light-emitting area; 12—Second micro-LED; 020—Active layer; 13—Third micro-LED; 030—Second semiconductor layer; 20—Optical component; 040—First electrode; 30—Spacer; 050—Second electrode; 100—Substrate; 060—Insulation layer; 200—Pixel unit; 300—Spacer; S1—Display screen.

DETAILED DESCRIPTION OF EMBODIMENTS

The present disclosure is explained below through specific embodiments. Those skilled in the art can easily understand other advantages and functions of the present disclosure from the disclosure of this specification. The present disclosure can also be implemented by other different specific embodiments, and various details in the present disclosure can be modified or changed based on different viewpoints and applications without departing from the spirit of the present disclosure.

In the description of the present disclosure, it should be noted that orientations or positional relationships indicated by terms "above" and "below" are the orientations or positional relationships shown in the drawings, or the orientations or positional relationships that products of the present disclosure are commonly placed when the products are used, which are merely used to facilitate and simplify the description of the present disclosure, but not to indicate or imply that the referred devices or elements must have a specific orientation, or be constructed and operated in the specific orientation, and therefore cannot be understood as limiting of the present disclosure. In addition, terms "first" and "second" are merely used to distinguish descriptions, and cannot be understood as indicating or implying relative importance. If a certain layer is defined to be on another layer or substrate, it should also be understood that the certain layer may be directly on another layer or substrate, or there may be an intermediate layer.

FIG. 1 illustrates a schematic structural view of a display device in a related art. The display device includes a substrate 1, and multiple pixel units arranged on the substrate 1. Each of the multiple pixel unit includes multiple micro-LEDs 2. For example, each pixel unit includes three micro-LEDs, i.e., a red micro-LED, a green micro-LED, and a blue micro-LED. The multiple micro-LEDs 2 are arranged on an upper surface of the substrate 1 at intervals from left to right.

When the above display device is applied to a projection product with a small light-emitting angle or a display product with a small viewing angle, an optical component 3 is required to be arranged on a side of the micro-LEDs 2 facing away the substrate 1. The optical component 3 can adjust light-emitting angles of emitting lights from the micro-LEDs 2 and thus adjust a light-emitting angle of each pixel unit and the display device. However, since the multiple micro-LEDs 2 are arranged on an upper surface of the substrate 1 from left to right in sequence, the light-emitting angles of the emitting lights of different micro-LEDs 2 are different, that is to say, the emitting lights of different micro-LEDs 2 enter the optical component 3 at different angles, and the emitting lights of different micro-LEDs 2 emit from the optical component 3 at different angles, so that only some of the emitting lights of the micro-LEDs 2 are mixed, which is prone to lead a dispersion phenomenon, and a color difference problem of a displayed image at different viewing angles will be easily caused. If the multiple micro-LEDs 2 in FIG. 1 are a red micro-LED, a green micro-LED and a blue micro-LED respectively from left to right, the emitting light of the red micro-LED is positioned a little further to the right, and the emitting light of the blue micro-LED is positioned a little further to the left, which causes a displaying color of a right area of a same pixel unit to be redder or yellower, while a displaying color of a left area of the same pixel unit is bluer, thereby resulting in poor color consistency.

In order to solve the above problem, in the present disclosure, the multiple micro-LEDs of the same pixel unit are arranged on a circumferential line with a point A as a center and R as a radius, and the emitting lights of different micro-LEDs coincide after rotating around a preset axis by a predetermined angle, the preset axis being passing through the point A and perpendicular to a plane where the circumferential line is located, which could reduce the difference of the emitting lights from the multiple micro-LEDs and effectively avoid the color difference problem existing in pixel units.

Figure 2:
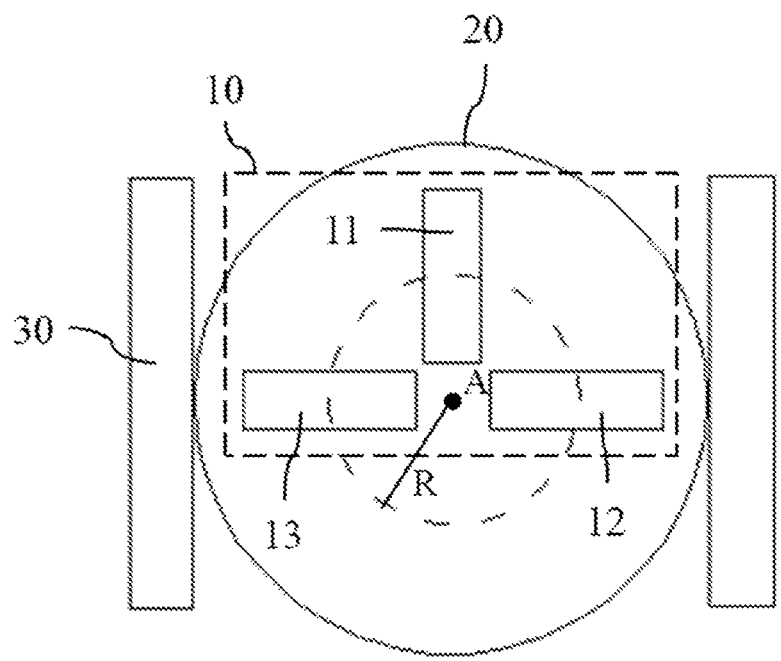
FIG. 2 illustrates a top view of an LED pixel unit according to an embodiment of the present disclosure.
Figure 4:
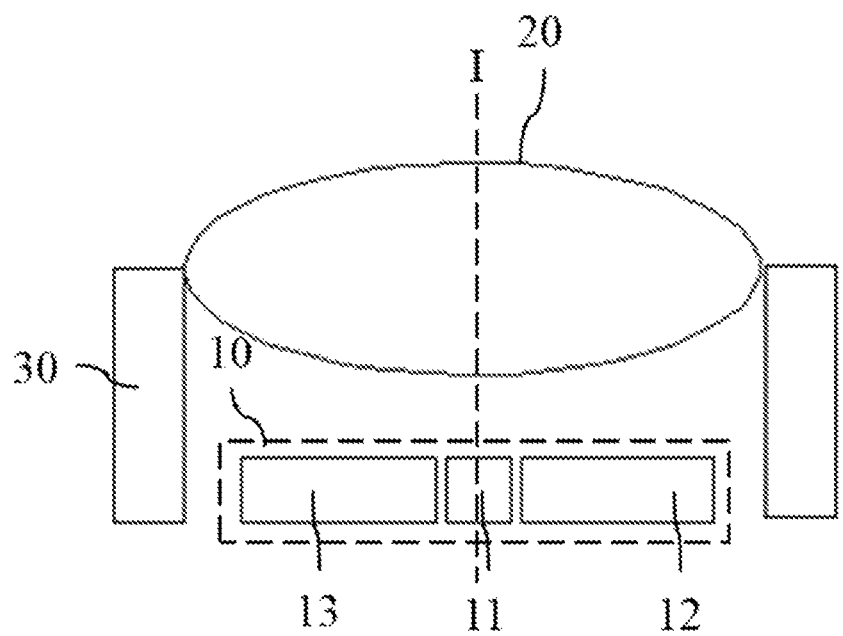
FIG. 4 illustrates a front view of an LED pixel unit according to an embodiment of the present disclosure.

According to a first aspect of the present disclosure, an LED pixel unit is provided. Referring to FIGS. 2 and 4, the LED pixel unit includes multiple micro-LEDs 10 and an optical component 20. Each of a length and a width of each micro-LED 10 is in a range from 1 μm to 100 μm. The multiple micro-LEDs 10 have different light-emitting wavelengths, and are arranged on a circumferential line with a point A as a center and R as a radius. The micro-LEDs 10 are respectively provided with light-emitting surfaces with a same orientation, and the light-emitting surfaces are parallel to a plane where the circumferential line is located. Emitting lights of the different micro-LEDs 10 rotate around a preset axis I by a predetermined angle and then coincide, and the preset axis I passes through the point A and is perpendicular to the plane where the circumferential line is located. The optical component 20 is arranged to face toward the light-emitting surfaces of the micro-LEDs 10 with a preset distance from the light-emitting surfaces. An area of a projection of the optical component 20 on a vertical projection is greater than or equal to an area of a projection of the multiple micro-LEDs 10 on the vertical projection, and the vertical projection refers to a projection in a projection in a direction parallel to the preset axis I. The optical component 20 is used to receive the emitting lights from the light-emitting surfaces, and enable the emitting lights from the light-emitting surfaces to emit from the optical component 20 at a preset light-emitting angle, i.e., a light-emitting angle of the LED pixel unit. In the embodiment, the light-emitting angle of the LED pixel unit is equal or smaller than 80°.

A light shielding layer is formed between each two adjacent micro-LEDs 10. A material of the light shielding layer includes, but is not limited to, black glue, which is specifically formed by dispersing black dye molecules or nano carbon particles in epoxy resin, acrylic or silica gel. In the embodiment, each micro-LED 10 may be driven independently.

In a same LED pixel unit, the multiple micro-LEDs 10 are arranged to have the above-mentioned structure, such that the emitting lights of the multiple micro-LEDs 10 can enter the optical component 20 at a same first angle, and can emit from the optical component 20 at a same second angle, thereby avoiding the dispersion phenomenon of the LED pixel unit, and further avoiding the color difference problem at different viewing angles of the LED pixel unit caused by the dispersion phenomenon, especially for the LED pixel unit with a small light-emitting angle.

Figure 6:
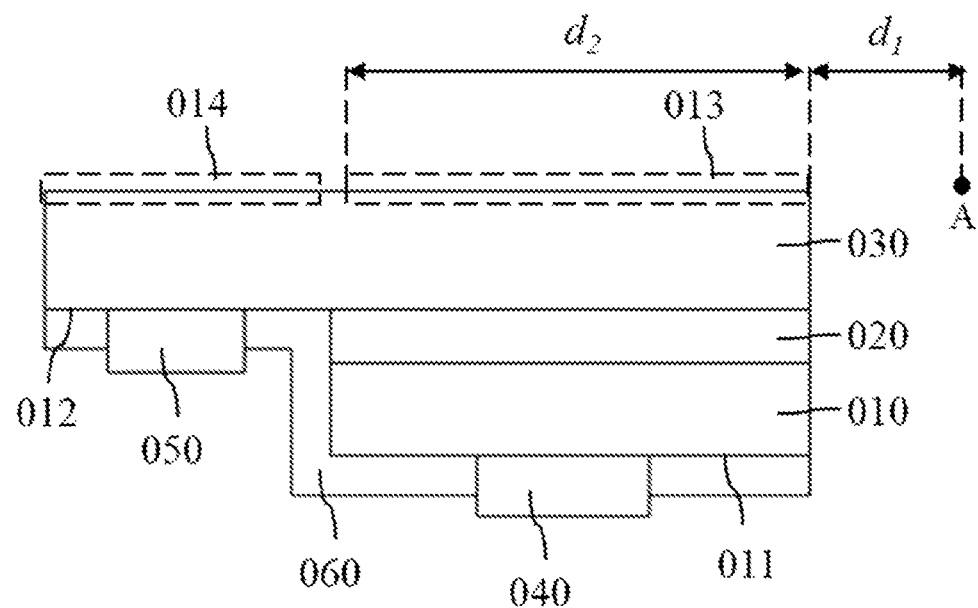
FIG. 6 illustrates a schematic structural view of a micro-LED according to an embodiment of the present disclosure.
Figure 7:
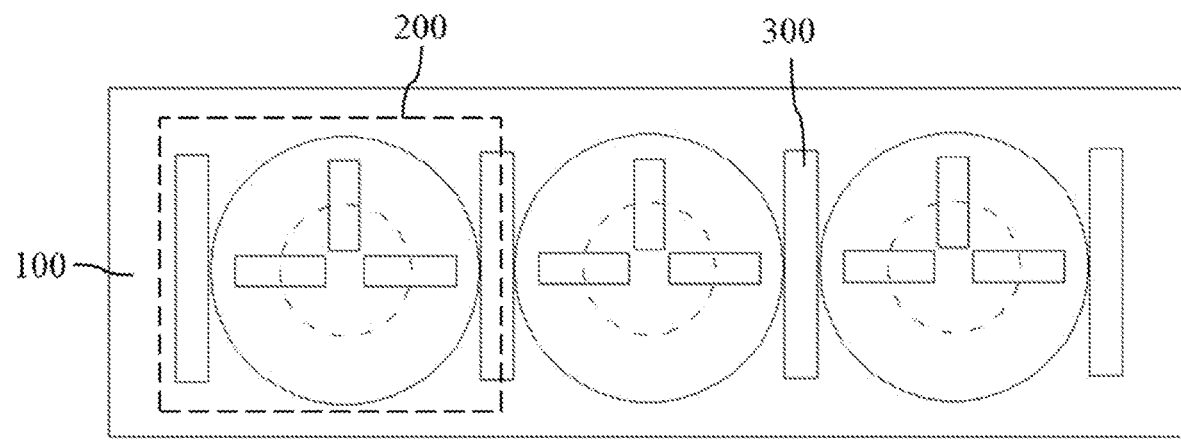
FIG. 7 illustrates a top view of a display panel according to an embodiment of the present disclosure.
Figure 8:
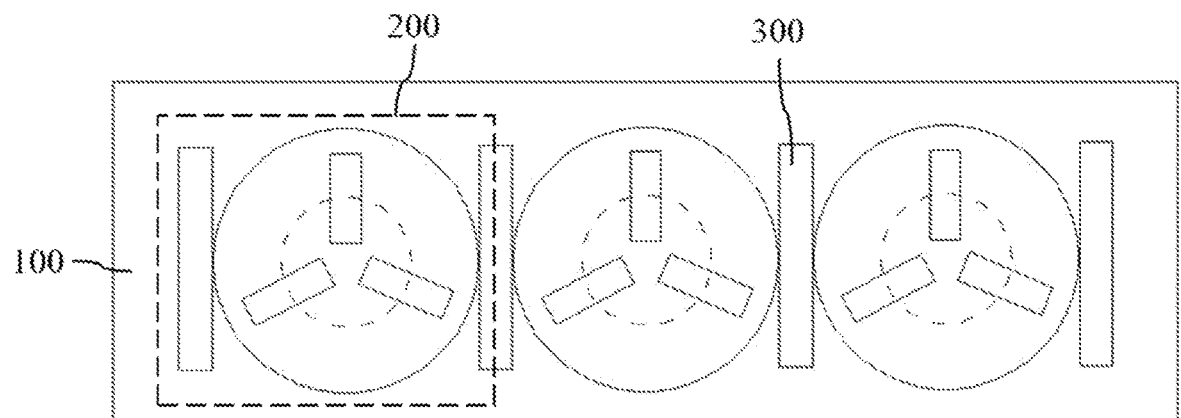
FIG. 8 illustrates a top view of a display panel according to another embodiment of the present disclosure.
Figure 9:
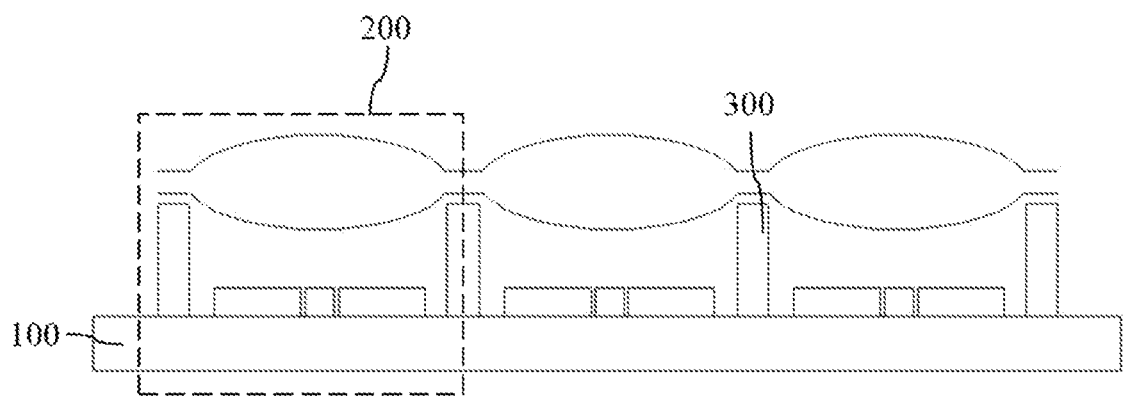
FIG. 9 illustrates a front view of a display panel according to an embodiment of the present disclosure.
Figure 10:
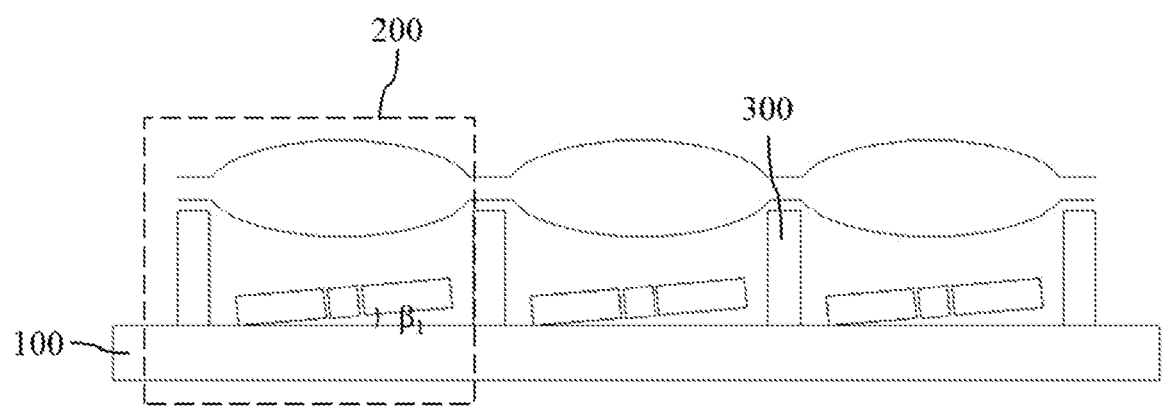
FIG. 10 illustrates a front view of a display panel according to another embodiment of the present disclosure.

In an illustrative embodiment, referring to FIGS. 2 and 6, the light-emitting surface of each micro-LED 10 includes a light-emitting area 013 and a non-light-emitting area 014. The light-emitting area 013 is located on a side of the micro-LED 10 near the point A, and the non-light-emitting area 014 is located on a side of the micro-LED 10 far away from the point A. A spacing between the light-emitting area 013 and the point A is $d_1$, and a length of the light-emitting area 013 in a radial direction of the circumferential line is $d_2$, where $d_1 \geq d_2$, or $d_1 > d_2$. Values of $d_1$ and $d_2$ are in a range from 1 μm to 100 μm. Further, in an illustrated embodiment, a ratio between the spacing $d_1$ and the spacing $d_2$ is a preset value.

In an illustrative embodiment, $d_1$ is smaller than $d_2$, and the value of $d_1$ is in a range from 2 μm to 4 μm, and the value of $d_2$ is in a range from 8 μm to 15 μm. The above light-emitting areas 013 of the multiple micro-LEDs 10 are all located on the sides of the micro-LEDs 10 near the point A, and the spacing $d_1$ between each of the above-mentioned light-emitting areas and the point A is smaller, such that each of the micro-LEDs 10 has a structure similar to a point light source, thereby avoiding the dispersion phenomenon of the LED pixel unit and the color difference at different viewing angles. The value of $d_1$ may be 2 μm, and the value of $d_2$ is 10 μm.

In an illustrative embodiment, areas of the light-emitting areas 013 of the multiple micro-LEDs 10 are the same, which can ensure that the emitting lights of the different micro-LEDs 10 can coincide after rotating around the preset axis I by the predetermined angle, thereby ensuring the consistency of the emitting lights of the different micro-LEDs 10.

In an illustrative embodiment, referring to FIG. 6, each micro-LED 10 includes a first semiconductor layer 010, an active layer 020 and a second semiconductor layer 030 which are sequentially arranged in a direction of the preset axis I. Specifically, the first semiconductor layer 010 may be a P-type semiconductor layer, the second semiconductor layer 030 may be an N-type semiconductor layer, and the active layer 020 may be a multi-layer quantum well layer, which can provide radiation of red light or green light or blue light. The P-type semiconductor layer, the multi-layer quantum well layer and the N-type semiconductor layer are only basic components of the micro-LED 10. On this basis, the micro-LED 10 may also include other functional structure layers that can optimize the performance of the micro-LED 10.

For the micro-LED 10 described above, a surface of the second semiconductor layer 030 facing away from the first semiconductor layer 010 is the light-emitting surface, and a first stepped surface 011 and a second stepped surface 012 are disposed on a surface of the micro-LED 10 opposite to the light-emitting surface. The first stepped surface 011 is a surface of the first semiconductor layer 010 facing away from the second semiconductor layer 030, which is opposite to the light-emitting area 013 of the light-emitting surface and is located at the side of the micro-LED 10 near the point A. The second stepped surface 012 is exposed from the second semiconductor layer 030, which is opposite to the non-light-emitting area 014 of the light-emitting surface, and is located at the side of the micro-LED 10 far away from the point A. The first stepped surface 011 is located at the side of the micro-LED 10 near the point A, and the spacing $d_1$ between the first stepped surface and the point A is smaller, such that the micro-LEDs 10 can be configured to each have a structure similar to a point light source, thereby avoiding the dispersion phenomenon of the LED pixel unit and the color difference at different viewing angles.

In an illustrative embodiment, a first electrode 040 is formed on the first stepped surface 011, and the first electrode 040 is electrically connected to the first semiconductor layer 010. A second electrode 050 is formed on the second stepped surface 012, and the second electrode 050 is electrically connected to the second semiconductor layer 030.

In an illustrative embodiment, the first stepped surface 011 and the second stepped surface 012 are each covered with an insulating layer 060, which is a single-layer insulating layer or a distributed Bragg reflector. When the insulating layer 060 is a distributed Bragg reflector, it can be made by alternately laminating multiple materials with different refractive indices into multiple layers by using a technology such as electron beam evaporation or ion beam sputtering. A material of the distributed Bragg reflector may be at least two of different materials consisting of $SiO_2$, $TiO_2$, $ZnO_2$, $ZrO_2$, $Cu_2O_3$, and $Al_2O_3$.

Figure 3:
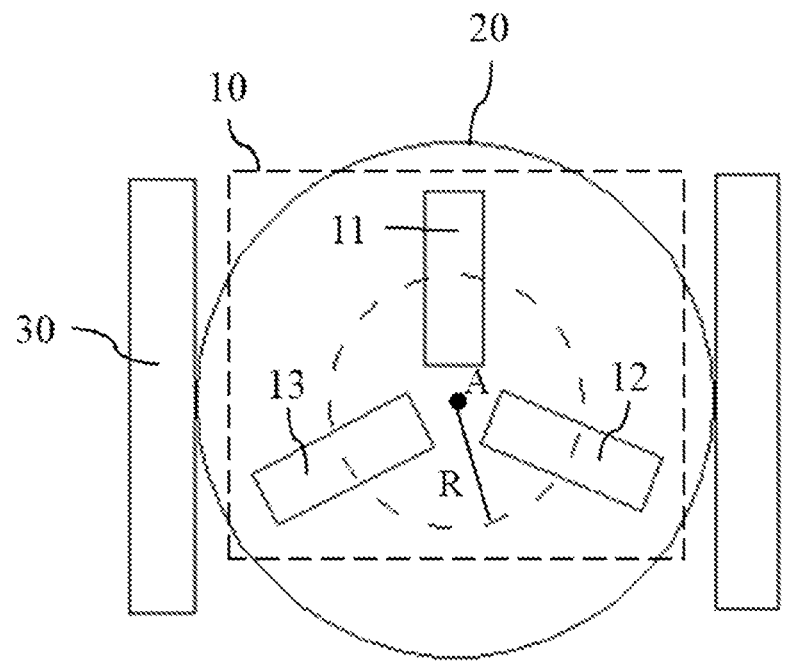
FIG. 3 illustrates a top view of an LED pixel unit according to another embodiment of the present disclosure.

In an illustrative embodiment, referring to FIG. 3, the multiple micro-LEDs 10 are evenly distributed on the circumferential line. The LED pixel unit includes three micro-LEDs 10, and an angle between each two adjacent micro-LEDs 10 is 120°.

The three micro-LEDs 10 are a first micro-LED 11, a second micro-LED 12, and a third micro-LED 13, respectively. The first micro-LED 11, the second micro-LED 12 and the third micro-LED 13 have different light-emitting wavelengths, and are ones of a red LED chip, a green LED chip, and a blue LED chip. It should be noted that the number of the multiple micro-LEDs 10 is not limited to three, and the number of the multiple micro-LEDs 10 can be increased or decreased according to an actual situation.

In an illustrative embodiment, the first micro-LED 11 is a red LED chip, the second micro-LED 12 is a green LED chip, and the third micro-LED 13 is a blue LED chip. It should be noted that the description that the first micro-LED 11, the second micro-LED 12 and the third micro-LED 13 are the red LED chip, the green LED chip and the blue LED chip, respectively is illustrative, the types of the first micro-LED 11, the second micro-LED 12 and the third micro-LED 13 are not limited in the present disclosure.

In an illustrative embodiment, referring to FIG. 2, the multiple micro-LEDs 10 are sequentially arranged on the circumferential line. The LED pixel unit includes three micro-LEDs 10, an angle between some adjacent micro-LEDs 10 is 90°, and an angle between some adjacent micro-LEDs 10 is 180°. In this embodiment, an angle between the first micro-LED 11 and the second micro-LED 12 is 90°, an angle between the first micro-LED 11 and the third micro-LED 13 is 90°, and an angle between the second micro-LED 12 and the third micro-LED 13 is 180°.

In an illustrative embodiment, referring to FIG. 4, a sum of widths of the multiple micro-LEDs 10 is smaller than or equal to a width of the optical component 20, which is determined by the effect of the optical component 20 on the emitting lights from the multiple micro-LEDs 10. Further, in order to avoid interference between adjacent LED pixel units, the width of the optical component 20 is required to be smaller than or equal to the width of the LED pixel unit.

Moreover, a sum of lengths of the multiple micro-LEDs 10 is smaller than or equal to a length of the optical component 20, which is determined by the effect of the optical component 20 on the emitting lights from the multiple micro-LEDs 10. Further, in order to avoid interference between adjacent LED pixel units, the length of the optical component 20 is required to be smaller than or equal to a length of the LED pixel unit.

In an illustrative embodiment, two sides of the LED pixel unit are provided with two spacers 30, respectively. Under a blocking effect of the spacers 30, the light-emitting angles of the emitting lights reaching the optical component 20 are smaller than or equal to 130°.

In an illustrative embodiment, referring to FIG. 4, a central axis of the optical component 20 coincides with the preset axis I. Since the light-emitting areas 013 of the multiple micro-LEDs 10 of a same LED pixel unit are all located at the sides of the micro-LEDs 10 near the point A, and the spacing $d_1$ between each of the light-emitting areas 013 and the point A is smaller, the LED pixel unit can be configured to have a structure similar to a point light source, such that when the central axis of the optical component 20 coincides with the preset axis I, the LED pixel unit can emit lights, which are approximately parallel with each other.

Figure 5:
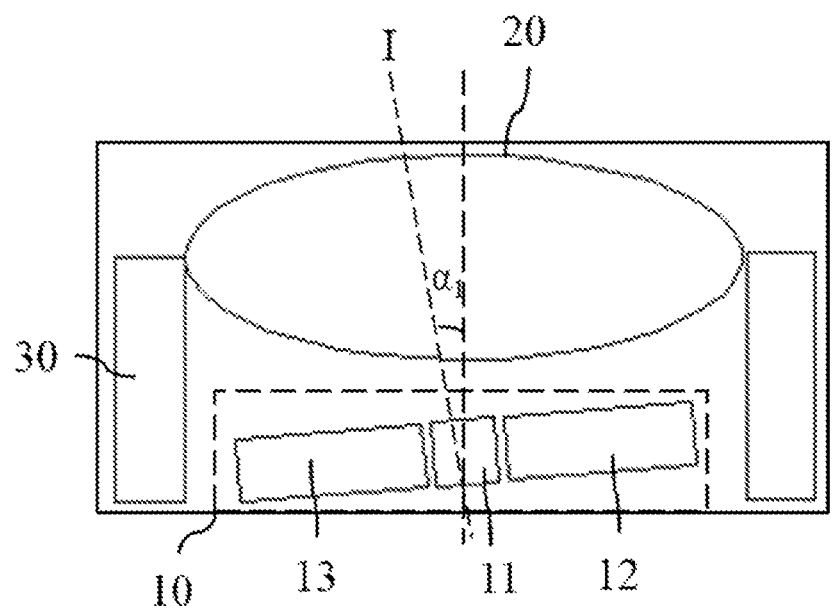
FIG. 5 illustrates a front view of an LED pixel unit according to another embodiment of the present disclosure.

In an illustrative embodiment, referring to FIG. 5, an angle $\alpha_1$ between the central axis of the optical component 20 and the preset axis I is greater than 5°.

In an illustrative embodiment, the optical component 20 is one of a micro lens, a micro prism, and a micro mirror. The micro lens includes, but is not limited to, a Fresnel lens, a diffusion lens, a convex lens and a concave lens. The micro mirror includes, but is not limited to, a concave mirror and a convex mirror. The optical component 20 is used to adjust the emitting angles of the emitting lights of the micro-LEDs 10 and change emitting paths of the emitting lights, so as to reduce, enlarge or change the emitting angles of the emitting lights of the micro-LEDs 10.

In an illustrative embodiment, the optical component 20 is a multifocal lens.

In an illustrative embodiment, a first end of each of the multiple micro-LEDs 10 facing toward the point A is used to receive a negative driving voltage, while a second end of each of the multiple micro-LEDs 10 facing away from the point A is used to receive a positive driving voltage. Alternatively, the first end of each of the multiple micro-LEDs 10 facing toward the point A is used to receive the positive driving voltage, while the second end of each of the multiple micro-LEDs 10 facing away from the point A is used to receive the negative driving voltage.

In an illustrative embodiment, the multiple micro-LEDs 10 are packaged using a MicroLED in Package (Mip) method. Specifically, the multiple micro-LEDs 10 are packaged together to form an Mip LED. Compared with the multiple micro-LEDs 10 being not packaged together, the Mip method can improve an assembly efficiency of the LED pixel units and thus the display panel. The Mip method combines micro-LED chips with a high-precision carrier board, thus realizing fan-out package, which can reduce the difficulty of testing and downstream mounting. The Mip method has at least the following advantages: the Mip LED can be fully tested and sorted, and be Bin-mixed, thus improving the display consistency of the display panel; lights and colors are separated, bad micro-LEDs can be screened out, which can ensure the yield before shipment and reduce the repair cost; and the Mip LED has better adaptability, and the Mip LED can meet the display applications with different dot pitches.

According to a second aspect of the present disclosure, a display panel is provided. Referring to FIGS. 7 to 10, the display device includes a substrate 100 and multiple pixel units 200 disposed on the substrate 100, each of the multiple pixel units 200 is the LED pixel unit in the above embodiments. A material of the substrate 100 includes, but is not limited to, glass, quartz, silicon, sapphire, an organic polymer, or an organic-inorganic composite material. A surface of the substrate 100 on which the multiple pixel units 200 are arranged is also provided with a circuit and a driving component to apply a light-emitting signal and a control voltage to the multiple pixel units 200.

A structure of each of the multiple pixel units 200 is explained hereinafter according to the structural views shown in FIGS. 2 to 6:

Referring to FIGS. 2 and 4, each LED pixel unit 200 includes multiple micro-LEDs 10 and an optical component 20. Each of a length and a width of each micro-LED 10 is in a range from 1 μm to 100 μm. The multiple micro-LEDs 10 have different light-emitting wavelengths, and are arranged on a circumferential line with a point A as a center and R as a radius. Surfaces of the multiple micro-LEDs 10 facing away from the substrate 100 are light-emitting surfaces with a same orientation, and the light-emitting surfaces are parallel to a plane where the circumferential line is located. Emitting lights of the different micro-LEDs 10 rotate around a preset axis I by a predetermined angle and then coincide, and the preset axis I passes through the point A and is perpendicular to the plane where the circumferential line is located. The optical component 20 is arranged at a side of the multiple micro-LEDs facing away from the substrate 100, and has a preset distance from the light-emitting surfaces. An area of a projection of the optical component 20 on a vertical projection is greater than or equal to an area of a projection of the multiple micro-LEDs 10 on the vertical projection, and the vertical projection refers to a projection in a projection in a direction parallel to the preset axis I. The optical component 20 is used to receive the emitting lights from the light-emitting surfaces, and enable the emitting lights from the light-emitting surfaces to emit from the optical component 20 at a preset light-emitting angle, i.e., a light-emitting angle of the pixel unit 200 and thus the display panel. In this embodiment, the light-emitting angle of the LED pixel unit 200 and the display panel is equal or smaller than 80°.

A light shielding layer is formed between each two adjacent micro-LEDs 10. A material of the light shielding layer includes, but is not limited to, black glue, which is specifically formed by dispersing black dye molecules or nano carbon particles in epoxy resin, acrylic or silica gel. In the embodiment, each micro-LED 10 may be driven independently.

In a same pixel unit 200, the multiple micro-LEDs 10 are arranged to have the above-mentioned structure, such that the emitting lights of the multiple micro-LEDs 10 can enter the optical component 20 at a same first angle, and can emit from the optical component 20 at a same second angle, thereby avoiding the dispersion phenomenon of the pixel unit 200, and further avoiding the color difference problem at different viewing angles of the pixel unit 200 caused by the dispersion phenomenon, especially for the pixel unit 200 and the display panel with a small light-emitting angle.

In an illustrative embodiment, referring to FIGS. 2 and 6, the light-emitting surface of each micro-LED 10 includes a light-emitting area 013 and a non-light-emitting area 014. The light-emitting area 013 is located on a side of the micro-LED 10 near the point A, and the non-light-emitting area 014 is located on a side of the micro-LED 10 far away from the point A. A spacing between the light-emitting area 013 and the point A is $d_1$, and a length of the light-emitting area 013 in a radial direction of the circumferential line is $d_2$, where $d_1 \leq d_2$, or $d_1 > d_2$. Values of $d_1$ and $d_2$ are in a range from 1 μm to 100 μm.

In an illustrative embodiment, $d_1$ is smaller than $d_2$, and the value of $d_1$ is in a range from 2 μm to 4 μm, and the value of $d_2$ is in a range from 8 μm to 15 μm. The above-mentioned light-emitting areas 013 of the multiple micro-LEDs 10 are all located on the sides of the micro-LEDs 10 near the point A, and the spacing $d_1$ between each of the above-mentioned light-emitting areas and the point A is smaller, such that each of the micro-LEDs 10 has a structure similar to a point light source, thereby avoiding the dispersion phenomenon of the pixel unit 200 and the color difference at different viewing angles. The value of $d_1$ may be 2 μm, and the value of $d_2$ is 10 μm.

In an illustrative embodiment, areas of the light-emitting areas 013 of different micro-LEDs 10 are the same, which can ensure that the emitting lights of the different micro-LEDs 10 can coincide after rotating around the preset axis I by the predetermined angle, thus ensuring the consistency of the emitting lights of the different micro-LEDs 10.

In an illustrative embodiment, referring to FIG. 6, each micro-LED 10 includes a first semiconductor layer 010, an active layer 020 and a second semiconductor layer 030 which are sequentially arranged in a direction of the preset axis I. Specifically, the first semiconductor layer 010 may be a P-type semiconductor layer, the second semiconductor layer 030 may be an N-type semiconductor layer, and the active layer 020 may be a multi-layer quantum well layer, which can provide radiation of red light or green light or blue light. The P-type semiconductor layer, the multi-layer quantum well layer and the N-type semiconductor layer are only basic components of the micro-LED 10. On this basis, the micro-LED 10 may also include other functional structure layers that can optimize the performance of the micro-LED 10.

For the micro-LED 10 described above, a surface of the second semiconductor layer 030 facing away from the first semiconductor layer 010 is the light-emitting surface, and a first stepped surface 011 and a second stepped surface 012 are disposed on a surface of the micro-LED 10 opposite to the light-emitting surface. The first stepped surface 011 is a surface of the first semiconductor layer 010 facing away from the second semiconductor layer 030, which is opposite to the light-emitting area 013 of the light-emitting surface and is located at the side of the micro-LED 10 near the point A. The second stepped surface 012 is exposed from the second semiconductor layer 030, which is opposite to the non-light-emitting area 014 of the light-emitting surface, and is located at the side of the micro-LED 10 far away from the point A. The first stepped surface 011 is located at the side of the micro-LED 10 near the point A, and the spacing $d_1$ between the first stepped surface and the point A is smaller, such that the micro-LEDs 10 can be configured to each have a structure similar to a point light source, thereby avoiding the dispersion phenomenon of the pixel unit 200 and the color difference at different viewing angles.

In an illustrative embodiment, a first electrode 040 is formed on the first stepped surface 011, and the first electrode 040 is electrically connected to the first semiconductor layer 010. A second electrode 050 is formed on the second stepped surface 012, and the second electrode 050 is electrically connected to the second semiconductor layer 030.

In an illustrative embodiment, the first stepped surface 011 and the second stepped surface 012 are each covered with an insulating layer 060, which is a single-layer insulating layer or a distributed Bragg reflector. When the insulating layer 060 is a distributed Bragg reflector, it can be made by alternately laminating multiple materials with different refractive indices into multiple layers by using a technology such as electron beam evaporation or ion beam sputtering. A material of the distributed Bragg reflector may be at least two of different materials consisting of $SiO_2$, $TiO_2$, $ZnO_2$, $ZrO_2$, $Cu_2O_3$, and $Al_2O_3$.

In an illustrative embodiment, referring to FIG. 3, the multiple micro-LEDs 10 are evenly distributed on the circumferential line. The LED pixel unit includes three micro-LEDs 10, and an angle between each two adjacent micro-LEDs 10 is 120°.

The three micro-LEDs 10 are a first micro-LED 11, a second micro-LED 12, and a third micro-LED 13, respectively. The first micro-LED 11, the second micro-LED 12 and the third micro-LED 13 have different light-emitting wavelengths, and are ones of a red LED chip, a green LED chip, and a blue LED chip. It should be noted that the number of the multiple micro-LEDs 10 is not limited to three, and the number of the multiple micro-LEDs 10 can be increased or decreased according to an actual situation.

In an illustrative embodiment, the first micro-LED 11 is a red LED chip, the second micro-LED 12 is a green LED chip, and the third micro-LED 13 is a blue LED chip. It should be noted that the description that the first micro-LED 11, the second micro-LED 12 and the third micro-LED 13 are the red LED chip, the green LED chip and the blue LED chip, respectively is illustrative, the types of the first micro-LED 11, the second micro-LED 12 and the third micro-LED 13 are not limited in the present disclosure.

In an illustrative embodiment, referring to FIG. 2, the multiple micro-LEDs 10 are sequentially arranged on the circumferential line. The LED pixel unit includes three micro-LEDs 10, an angle between some adjacent micro-LEDs 10 is 90°, and an angle between some adjacent micro-LEDs 10 is 180°. In this embodiment, an angle between the first micro-LED 11 and the second micro-LED 12 is 90°, an angle between the first micro-LED 11 and the third micro-LED 13 is 90°, and an angle between the second micro-LED 12 and the third micro-LED 13 is 180°.

In an illustrative embodiment, referring to FIG. 4, a sum of widths of the multiple micro-LEDs 10 is smaller than or equal to a width of the optical component 20, which is determined by the effect of the optical component 20 on the emitting lights from the multiple micro-LEDs 10. Further, in order to avoid interference between adjacent pixel units 200, the width of the optical component 20 is required to be smaller than or equal to the width of the pixel unit 200.

Moreover, a sum of lengths of the multiple micro-LEDs 10 is smaller than or equal to a length of the optical component 20, which is determined by the effect of the optical component 20 on the emitting lights from the multiple micro-LEDs 10. Further, in order to avoid interference between adjacent pixel units 200, the length of the optical component 20 is required to be smaller than or equal to a length of the pixel unit 200.

In an illustrative embodiment, a spacer 300 is arranged between two adjacent pixel unit 200. Under a blocking effect of the spacer 300, the light-emitting angles of the emitting lights reaching the optical component 20 are smaller than or equal to 130°.

In an illustrative embodiment, referring to FIG. 4, a central axis of the optical component 20 coincides with the preset axis I, that is to say, the central axis of the optical component 20 and the preset axis I are each perpendicular to the substrate 100. Since the light-emitting areas 013 of the multiple micro-LEDs 10 of a same pixel unit 200 are all located at the sides of the micro-LEDs 10 near the point A, and the spacing $d_1$ between each of the light-emitting areas 013 and the point A is smaller, the pixel unit 200 can be configured to have a structure similar to a point light source, such that when the central axis of the optical component 20 coincides with the preset axis I, the pixel unit 200 can emit lights, which are approximately parallel with each other.

In an illustrative embodiment, referring to FIG. 5, an angle $\alpha_1$ between the central axis of the optical component 20 and the preset axis I is greater than 5°. That is to say, the central axis of the optical component 20 is perpendicular to the substrate 100, and an angle $\beta_1$ between the preset axis I and the substrate 100 is greater than 5°.

In an illustrative embodiment, the optical component 20 is one of a micro lens, a micro prism, and a micro mirror. The micro lens includes, but is not limited to, a Fresnel lens, a diffusion lens, a convex lens and a concave lens. The micro mirror includes, but is not limited to, a concave mirror and a convex mirror. The optical component 20 is used to adjust the emitting angles of the emitting lights of the micro-LEDs 10 and change emitting paths of the emitting lights, so as to reduce, enlarge or change the emitting angles of the emitting lights of the micro-LEDs 10.

In an illustrative embodiment, the optical component 20 is a multifocal lens.

In summary, the display panel in this embodiment is not only suitable for a situation that the light-emitting angle is smaller than or equal to 80°, but also suitable for a situation that the multiple micro-LEDs 10 are offset on the substrate 100, that is, the angle between the preset axis I and the substrate 100 is greater than 5°. For the above two situations, by arranging the multiple micro-LEDs 10 in the same pixel unit 200 on a circumferential line with a point A as a center and R as a radius, and emitting lights of the multiple micro-LEDs coincide after rotating around a preset axis by a predetermined angle, thereby avoiding the dispersion phenomenon of the pixel unit 200 and the display panel, and further avoiding the color difference problem.

According to a third aspect of the present disclosure, a display screen is provided, which include the display panel described in the above embodiments.

Figure 11:
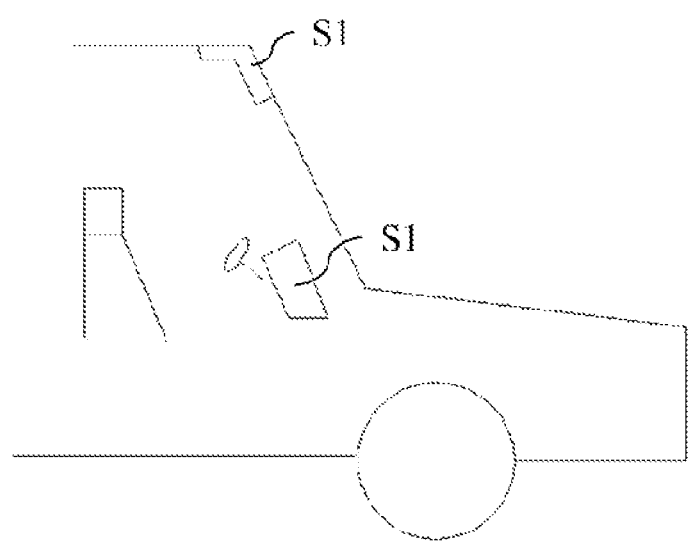
FIG. 11 illustrates a schematic structural view of a display screen using as a vehicle-mounted display screen according to an embodiment of the present disclosure.

As shown in FIG. 11, FIG. 11 illustrates an application scenario of a display screen S1 using as a vehicle-mounted display screen. The display screen S1 can be arranged at any position within a visual field observed by a driver in a vehicle. Under normal circumstances, when the driver in the vehicle observes the display screen S1, he does not face to the display screen S1 directly, and there is a slant viewing angle or a small viewing angle. Further, passengers in the vehicle also need to observe the display screen S1 from different angles. By using the display screen S1 in the present disclosure, the problem of color difference caused by dispersion can be well avoided, and the display screen S1 has good color consistency at different viewing angles, which brings better viewing experience to the driver and the passengers inside the vehicle. In addition, the display screen S1 can also be arranged on a roof of the vehicle. Because there is no color difference problem, even if the driver observes the display screen S1 at a very small angle, a better viewing effect can still be obtained.

According to the above technical solutions, multiple micro-LEDs of a same LED pixel unit are arranged on a circumferential line with a point A as a center and R as a radius, emitting lights of the multiple micro-LEDs coincide after rotating around a preset axis by a predetermined angle, and the preset axis is configured to pass through the point A and is perpendicular to a plane where the circumferential line is located. Further, the emitting lights of the multiple micro-LEDs can enter an optical component at a same first angle, and can emit from the optical component at a same second angle, thereby avoiding the dispersion phenomenon of the LED pixel unit, and further avoiding the color difference problem at different viewing angles of the LED pixel unit caused by the dispersion phenomenon, especially for the LED pixel unit with a small light-emitting angle.

Further, a light-emitting surface of each micro-LED includes a light-emitting area and a non-light-emitting area, the light-emitting area is located on a side of the micro-LED facing toward the point A, and a spacing $d_1$ between the light-emitting area and the point A is smaller. Therefore, the multiple micro-LEDs can be configured to be have a structure similar to a point light source, thereby avoiding the dispersion phenomenon of the LED pixel unit and the color difference problem at different viewing angles. When the multiple micro-LEDs are matched with the optical component, a central axis of the optical component coincides with the preset axis, so that the LED pixel unit can emit lights, which are approximately parallel with each other.

The above is merely preferred embodiment of the present disclosure. It should be noted that for those of ordinary skill in the art, several improvements and substitutions can be made without departing from the technical principles of the present disclosure. These improvements and substitutions should also be regarded as falling in the scope of protection of the present disclosure.

What is claimed is:

1. A light emitting diode (LED) pixel unit, comprising:
a plurality of micro-LEDs with different light-emitting wavelengths, arranged on a circumferential line with a point A as a center and R as a radius; wherein the plurality of micro-LEDs are provided with light-emitting surfaces with a same orientation, respectively; and
an optical component, arranged to face toward the light-emitting surfaces of the plurality of micro-LEDs and have a preset distance with respect to the light-emitting surfaces; wherein an area of a projection of the optical component on a vertical projection is greater than or equal to an area of a projection of the plurality of micro-LEDs on the vertical projection; and the optical component is configured to receive emitting lights from the light-emitting surfaces, and enable the emitting lights from the light-emitting surfaces to emit from the optical component at a preset light-emitting angle;
wherein a first end of each of the plurality of micro-LEDs facing toward the point A is configured to receive a negative driving voltage, and a second end of each of the plurality of micro-LEDs facing away from the point A is configured to receive a positive driving voltage.

2. The LED pixel unit according to claim 1, wherein each of the light-emitting surfaces comprises a light-emitting area and a non-light-emitting area, the light-emitting area is located on a side of a corresponding micro-LED of the plurality of micro-LEDs near the point A, and the non-light-emitting area is located on a side of the corresponding micro-LED of the plurality of micro-LEDs far away from the point A.

3. The LED pixel unit according to claim 2, wherein a spacing $d_1$ between the light-emitting area and the point A is smaller than or equal to a length $d_2$ of the light-emitting area in a radial direction of the circumferential line, and a ratio between the spacing $d_1$ and the spacing $d_2$ is a preset value.

4. The LED pixel unit according to claim 2, wherein a spacing $d_1$ between the light-emitting area and the point A is greater than a length $d_2$ of the light-emitting area in a radial direction of the circumferential line, and a ratio between the spacing $d_1$ and the spacing $d_2$ is a preset value.

5. The LED pixel unit according to claim 2, wherein a spacing $d_1$ between the light-emitting area and the point A is in a range from 1 μm to 100 μm, and a length $d_2$ of the light-emitting area in a radial direction of the circumferential line is in a range from 1 μm to 100 μm.

6. The LED pixel unit according to claim 5, wherein the spacing $d_1$ between the light-emitting area and the point A is in a range from 2 μm to 4 μm, and the length $d_2$ of the light-emitting area in the radial direction of the circumferential line is in a range from 8 μm to 15 μm.

7. The LED pixel unit according to claim 1, wherein the plurality of micro-LEDs are evenly distributed on the circumferential line.

8. The LED pixel unit according to claim 7, wherein an angle between each two adjacent micro-LEDs of the plurality of micro-LEDs is 120°.

9. The LED pixel unit according to claim 1, wherein an angle between some adjacent micro-LEDs of the plurality of micro-LEDs is 90°, and an angle between some adjacent micro-LEDs of the plurality of micro-LEDs is 180°.

10. The LED pixel unit according to claim 1, wherein a light-emitting angle of the LED pixel unit is smaller than or equal to 80°.

11. The LED pixel unit according to claim 1, comprising two spacers, wherein the two spacers are arranged to be opposite to one another and to be spaced by a preset spacing, and the plurality of micro-LEDs are dependently arranged in the preset spacing.

12. The LED pixel unit according to claim 1, wherein the plurality of micro-LEDs are packaged together to form a MicroLED in Package (Mip) LED.

13. The LED pixel unit according to claim 1, wherein the emitting lights of the plurality of micro-LEDs are capable of entering the optical component at a same first angle, and emitting from the optical component at a same second angle.

14. The LED pixel unit according to claim 1, wherein a sum of widths of the plurality of micro-LEDs is smaller than or equal to a width of the optical component, and a sum of lengths of the plurality of micro-LEDs is smaller than or equal to a length of the optical component.

15. A display panel, comprising:
a substrate; and
a plurality of pixel units arranged on the substrate, wherein each of the plurality of pixel units is the LED pixel unit according to claim 1, the plurality of micro-LEDs are arranged on the substrate, and the optical component is arranged at a side of the plurality of micro-LEDs facing away from the substrate.

16. A display screen, comprising the display panel according to claim 15.

17. A light emitting diode (LED) pixel unit comprising:
a plurality of micro-LEDs with different light-emitting wavelengths, arranged on a circumferential line with a point A as a center and R as a radius; wherein the plurality of micro-LEDs are provided with light-emitting surfaces with a same orientation, respectively; and an optical component, arranged to face toward the light-emitting surfaces of the plurality of micro-LEDs and have a preset distance with respect to the light-emitting surfaces; wherein an area of a projection of the optical component on a vertical projection is greater than or equal to an area of a projection of the plurality of micro-LEDs on the vertical projection; and the optical component is configured to receive emitting lights from the light-emitting surfaces, and enable the emitting lights from the light-emitting surfaces to emit from the optical component at a preset light-emitting angle;

wherein a first end of each of the plurality of micro-LEDs facing toward the point A is configured to receive a positive driving voltage, and a second end of each of the plurality of micro-LEDs facing away from the point A is configured to receive a negative driving voltage.

* * * * *